United States Patent
De Palma et al.

[11] Patent Number: 5,233,495
[45] Date of Patent: Aug. 3, 1993

[54] DEVICE FOR PROTECTING AGAINST OPERATIONAL OVERLOADS, AT OPENING, FOR STATIC RELAYS WITH SEMI-CONDUCTORS

[76] Inventors: Jian F. De Palma, Le Colovron, Châteauneuf, France, 73390; Jean-Jacques Rousseau, 5 Rue A. Merrheim, Saint-Etienne, France, 42100; Pierre Epron, 62 Rue Seignemartin, Lyon, France, 69003

[21] Appl. No.: 713,110

[22] Filed: Jun. 11, 1991

[30] Foreign Application Priority Data

Jun. 13, 1990 [FR] France ................ 90 07605

[51] Int. Cl.⁵ ............................................. H01H 9/42
[52] U.S. Cl. .......................................... 361/3; 361/9; 361/13; 361/58
[58] Field of Search ................. 361/3, 10, 11, 13, 58, 361/8, 9, 91

[56] References Cited

U.S. PATENT DOCUMENTS 4,389,691  6/1983  Hancock .................. 361/3
4,550,356 10/1985  Takahashi ................ 361/11

OTHER PUBLICATIONS

Elektronik, Sep. 1985 (FIG. 17 p. 127).
Revue de Physique Appliquee, Feb. 1989 (FIG. 6, p. 198).

Primary Examiner—Todd E. DeBoer
Attorney, Agent, or Firm—Dowell & Dowell

[57] ABSTRACT

A device for protecting a principal static relay including semi-conductors from overloads which includes an auxiliary static relay which is connected in series with a conventional parallel protection circuit and whose closure is controlled at the same time as the opening of the principal static relay.

4 Claims, 3 Drawing Sheets

DEVICE FOR PROTECTING AGAINST OPERATIONAL OVERLOADS, AT OPENING, FOR STATIC RELAYS WITH SEMI-CONDUCTORS

BACKGROUND OF THE INVENTION

The present invention relates to a device for protecting against operational overloads, at the opening, of static relays with semi-conductors.

HISTORY OF THE RELATED ART

It is known to protect controllable power switches which include semi-conductors (thyristors, bipolar transistors, field effect transistors, . . . ) against overvoltages and the voltage variations or transients which necessarily appears at the terminals of the component at the opening thereof. There is consequently provided, at the terminals of such static power switch, a protection circuit generally constituted by the placing in parallel of an overvoltage arrester of the varistor type and of a Resistor-Capacitor-Diode network (or part of this network comprising the capacitor, at minimum).

An illustration of this known technique is given by way of example in accompanying FIGS. 1 to 3.

The most simple known diagram is shown in FIG. 1. A static switch is shown constituted by a thyristor 1 which is placed in series with a load 2, with inherent self-induction coil 3 and resistor 4, itself supplied by a source 5 of D.C. voltage Vc.

This thyristor 1 is, in this example, a "GTO" thyristor, i.e. a gate-blockable thyristor whose starting and extinction are conventionally controlled, on its gate 8, by a control circuit 06 receiving tripping pulses on its input 7.

This thyristor 1 is protected:
against the voltage variations at opening by a "SNUBBER" circuit 9 comprising, in conventional manner, a polypropylene capacitor 10 supplied through a direct diode 11, to the terminals of which is connected a resistor 12 serving for discharge of capacitor 10; and
against overvoltages at opening by a varistor 13, or other type of overvoltage arrester, which limits the value of the voltage at the terminals of the thyristor 1 while absorbing the major part of the extra current due to the self-induction coil 3.

If it is now a question of switching a load 2 supplied with A.C. voltage Va, two cases are conventionally presented:

Either (cf. FIG. 2) the static relay, i.e. in this example the "GTO" thyristor 1, is an asymmetrical component (i.e. cannot support the application of a reverse voltage at its two terminals), and in that case it must be supplied through a rectifier (in this example through a rectifier bridge 14 with four diodes 15 to 18). Here again, the varistor 13 is provided at the terminals of the thyristor 1, as well as a capacitor 19 supplied through a direct diode 21, at the terminals of which is connected a resistor 20 serving for the discharge of the capacitor 19.

Or (FIG. 3), so-called "symmetrical" static relays (i.e. adapted to support a reverse voltage) are used, including two thyristors 21, 22 head to tail, connected in series with the A.C. source 30 of voltage Va and the load 2. Each thyristor 21, 22 is associated with a gated control circuit 23 and 24, respectively, and the protection against overvoltage at opening is always ensured by the varistor 13, connected to the terminals of the thyristors 21 and 22. Here again, a capacitor 19 is provided, with discharge resistor 20, to absorb the voltage variations at opening either of thyristor 21 or of thyristor 22. A preceding diode 11 is not used, since it is already included in a bridge 25. However, this assembly 19, 20 is connected in the diagonal of the rectifier bridge 25, to diodes 26 to 29, as it would not be possible to apply an A.C. voltage to the capacitor 19 without creating a considerable leakage current totally detrimental to the functioning of the installation.

These known devices present the following drawbacks:

When the static relay, such as the thyristor 1 of FIG. 1, is open, the varistor 13 which is connected to its terminals is continually subjected to all the supply voltage. In order to avoid an accelerated ageing of the overvoltage arrester, the watch voltage thereof must be dimensioned to values such that the current passing therethrough under that voltage does not create a strong dissipation in the overvoltage arrester. This solution leads to an over-dimensioning of the watch voltage and to the necessity of increasing the maximum voltage admissible of the controllable switch and, therefore, of choosing over-dimensioned controllable switches which are consequently more expensive.

The dimensioning of this overvoltage arrester in voltage is linked with the voltage of use of the controllable switch, with the maximum voltage admissible by this controllable switch and with the characteristic of limitation of the overvoltage arrester. This leads to a considerable overdimensioning of the switchable components based upon anticipated voltage variations. In an A.C. network of 220/380 volts, controllable components must be used which will withstand voltages between 1200 and 1400 volts. In an A.C. network of 660 volts, the components to be provided must withstand about 2000 volts, and expensive components must in that case be employed.

In the case of A.C. voltage supply, it is necessary, as has been seen hereinbefore with reference to FIGS. 2 and 3, to provide a rectifier bridge, at least, in order to avoid the capacitor 19 being supplied with alternating current, which would lead to a considerable, detrimental leakage current.

The power dissipated by the controllable switch used on an A.C. network and constituted by component(s) having non-symmetrical withstand voltages is considerable. It may attain 300 watts for 100 effective amps traversing the controllable switch.

SUMMARY OF THE INVENTION

The invention aims at overcoming these drawbacks. It relates to a device for protecting against operational overload at the opening of static relays which include semiconductors. The static relay comprises at least one controllable switch, for example of the thyristor GTO, transistor IGBT, bipolar transistor, field effect transistor . . . type. The protection device comprises at least one overvoltage arrester, for example of the varistor type, adapted to protect the static relay against overvoltages at the opening of the switch and at least one capacitor adapted to protect static relay against the voltage variations or transients at opening. This device is characterized in that the capacitor and the overvoltage arrester form at least a part of a parallel circuit of which a first terminal is connected to one of the two power terminals of the controllable switch and of which the other terminal is connected to the other power terminal of the switch through an auxiliary static relay whose closure is controlled at least from the beginning and at least during the major part of the duration of the phase of opening of the controllable switch.

The auxiliary static relay may be constituted by at least one thyristor of ordinary type (i.e. non-blockable by the gate) whose closure is controlled either simultaneously to the control of opening of the controllable switch, or slightly before, and which is then extinguished by itself, by natural cancellation of the current which traverses it.

BRIEF DESCRIPTION OF THE DRAWINGS

In any case, the invention will be readily understood and its advantages and other characteristics will become clear, on reading the following description of three non-limiting embodiments, with reference to the accompanying schematic drawings.

DESCRIPTION OF THE PREFERRED EMBODIMENT

Figure 1:
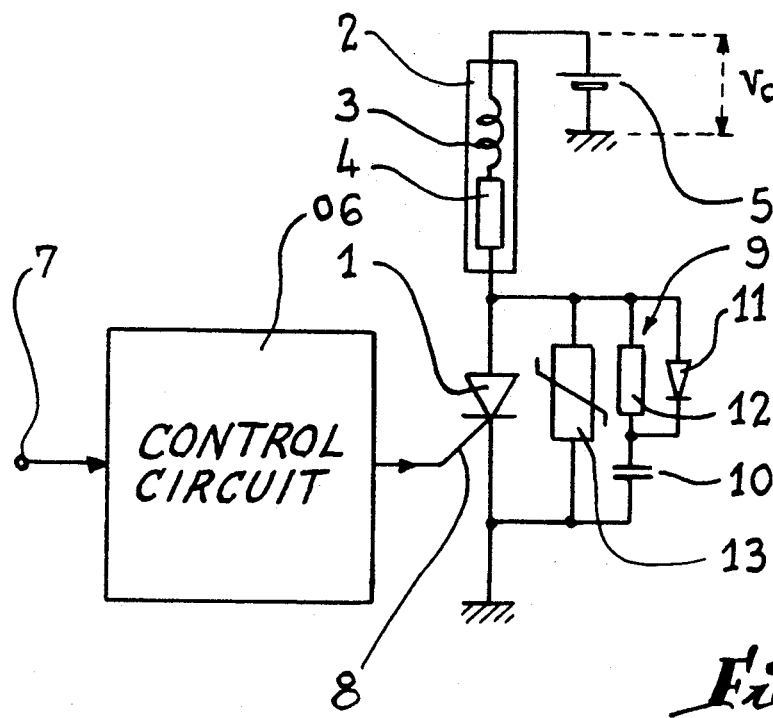
FIGS. 1 to 3 correspond to the prior art discussed hereinbefore.
Figure 4:
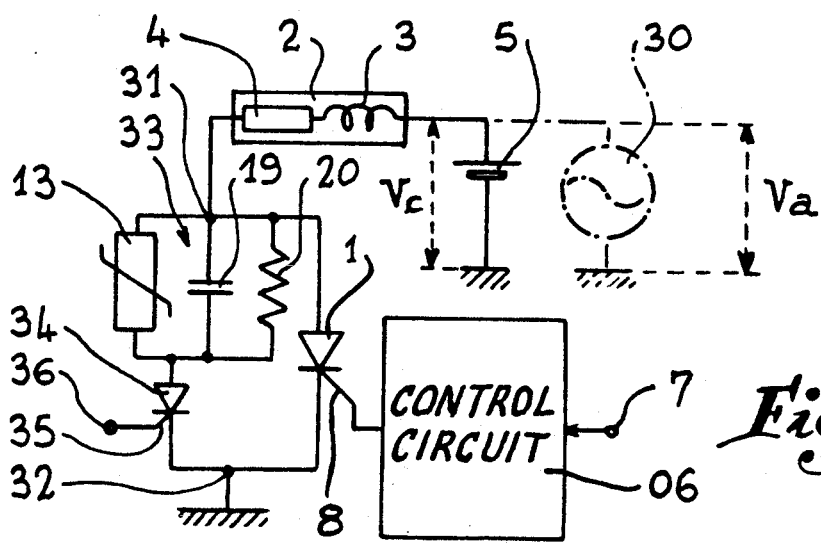
FIG. 4 is an electrical diagram of an embodiment of the device according to the invention for use with a static relay with one GTO thyristor connected in series with a load supplied with D.C. or A.C. voltage.

FIG. 4 illustrates the adaption of the invention to the conventional device described hereinbefore with reference to FIG. 1. The following is found again, in particular:

the source of D.C. power supply 5 supplying voltage Vc;

the load 2, with its self-induction coil 3 and its resistor 4;

and the GTO thyristor 8 (with its control circuit 06) which is connected in series with the load.

According to the invention, a particular circuit is connected to terminals 31, 32 of the thyristor 1, this circuit comprising:

a protection circuit 33 conventionally constituted by the placing in parallel of a varistor 13 (identical to those of FIGS. 1 to 3), of a for example polypropylene capacitor 19 (identical to capacitors 19 of FIGS. 2 and 3), and of a discharge resistor 20 (identical to resistors 20);

and an auxiliary thyristor 34, connected in series with the parallel circuit 33.

This auxiliary thyristor 34 is here an ordinary or GTO type thyristor, its gate 35 is controlled at 36 by starting pulses which are in practice synchronous with the extinction pulses of the GTO thyristor applied at 7 to circuit 06. The essential, for carrying out the invention, being that the thyristor 34 is conducting when the thyristor 1 begins to be blocked. It sufficient that the starting pulse of the thyristor 34 be applied at the same time or slightly after the of extinction of the thyristor 1, taking into account the slight delay due in particular to circuit 06, to the desaturation time of the thyristor 1, and the thyristor 34 is already started when the blocking pulse begins to act at 8.

Functioning of the device of FIG. 4 is as follows:

When it is desired to cut the supply of the load 2, i.e. open the static relay 1, a blocking pulse is applied at 7, while, simultaneously, a pulse for starting the auxiliary thyristor 34 is applied at 36. Taking into account the delay due to the time of desaturation of the GTO thyristor 1, thyristor 34 is started before the blocking pulse acts on the gate 8 of GTO thyristor 1. The conventional protection circuit 33 is then connected to the terminals of the thyristor 1, and it performs its role fully during the whole phase of extinction of this thyristor. Thyristor 34 then extinguishes naturally when the voltage at the terminals of the circuit 33 attains the value Vc of the supply voltage, since the current which passes through this thyristor attains at that moment the value zero. The thyristor 34 then being open, the varistor 13 no longer has any voltage at its terminals (at first approximation, the leakage current of thyristor 34 is here assumed to be zero), which considerably limits its ageing with respect to the devices of the prior art.

Figure 2:
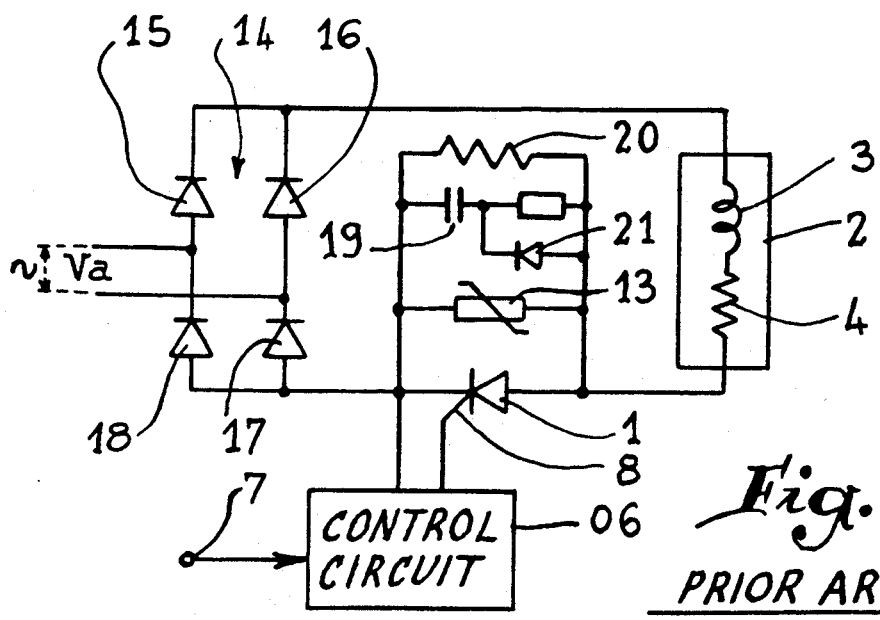

If, as indicated in dashed and dotted lines in FIG. 4, the thyristors (assumed to be symmetrical) are now imagined to be subjected to an A.C. voltage Va (generator 30 instead of the D.C. supply 5), the diagram obtained becomes the adaptation to the invention of the circuit of FIG. 2. It is ascertained that the preceding rectifier bridge 14 is no longer necessary since, concerning the rectified supply of capacitor 19, the thyristor 34 performs this rectifier role perfectly, in addition to its function previously described.

Figure 3:
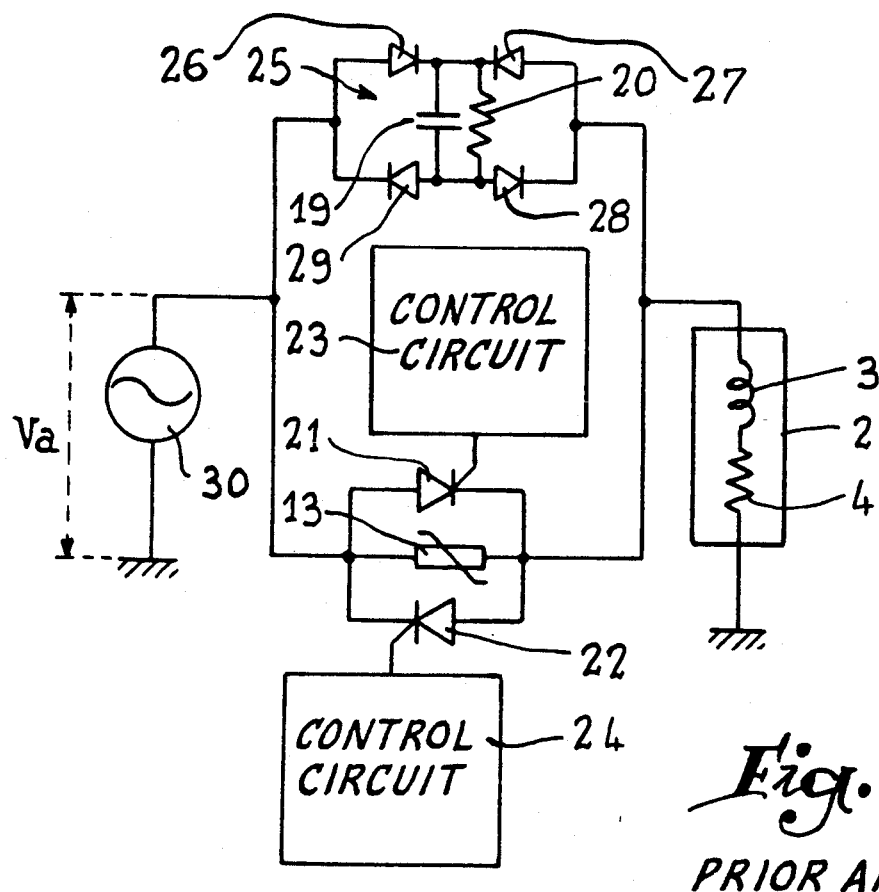

However, with an A.C. supply, it will, of course, be preferred to use a full-wave static relay, of the type for example such as described hereinbefore with reference to FIG. 3.

Figure 5:
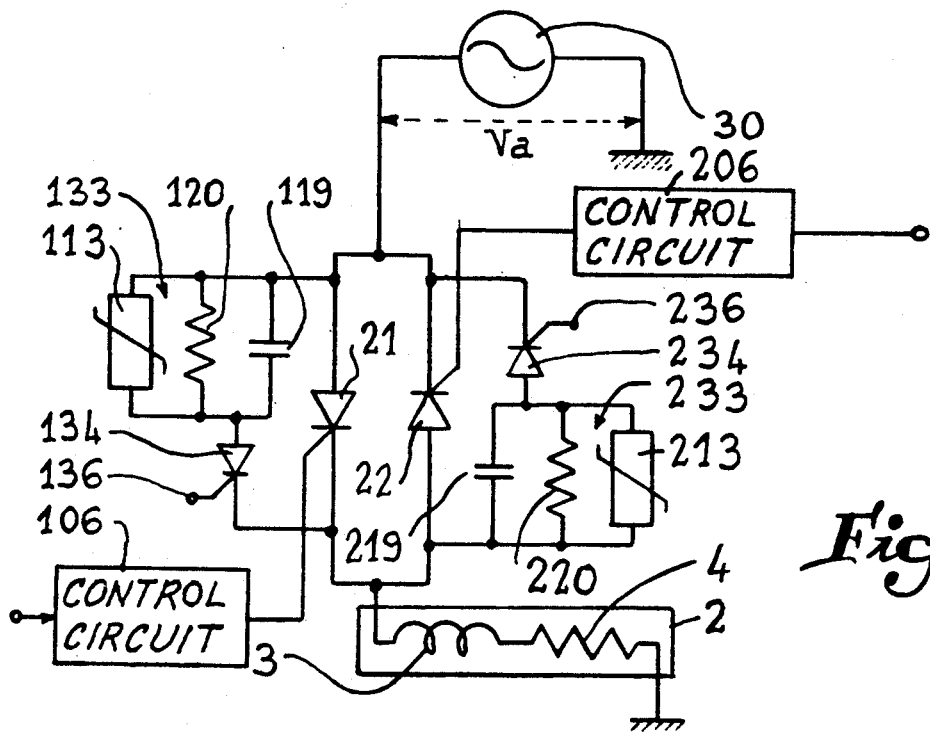
FIG. 5 shows an embodiment for use with a static relay with two symmetrical GTO thyristors, this static relay being connected in series with a load supplied with A.C. voltage.

With symmetrical thyristors, a parallel and head-to-tail assembly will be used, like in FIG. 3. Such use, adapted according to the invention, is shown in FIG. 5. This diagram therefore uses the same two GTO thyristors 21 and 22 as in FIG. 3, but each of these thyristors is associated with a protection circuit, with auxiliary thyristor, identical to the one described with reference to FIG. 4 and operating in the same manner:

with thyristor 21 there is associated an auxiliary thyristor 134 (identical to 34) in series with a protection circuit 133 (identical to 33);

and with thyristor 22 there is associated, in exactly the same manner, the auxiliary thyristor 234 in series with the protection circuit 233.

The elements relative to thyristors 21 and 22 have been designated in FIG. 5 by the same reference numerals as those relative, in FIG. 4, to thyristor 1, but respectively preceded by a "1" and a "2".

Nevertheless, it is often preferred to use, even under A.C. voltage, asymmetrical thyristors which, in practice, present much better qualities than the symmetrical thyristors.

Figure 6:
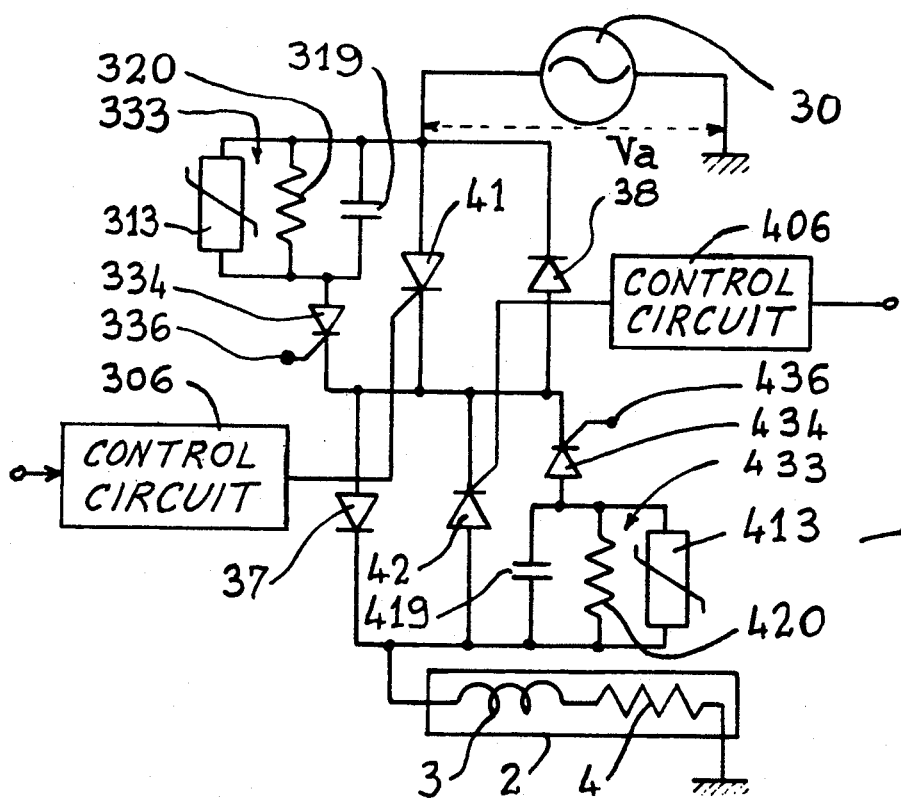
FIG. 6 shows an assembly similar to that of FIG. 5, but using two asymmetrical GTO thyristors.

Such thyristors must not be subjected to reverse voltages and, on this subject, FIG. 6 shows an embodiment according to the invention, using two GTO thyristors 41 and 42 connected in series and in opposite directions in a rectifier diode half-bridge 37 and 38. For the positive alternation, the thyristor 42 (in that case alone in reverse) is short-circuited by diode 37, for the negative alternation, the thyristor 41 (in that case alone in reverse) is short-circuited by diode 38.

For the rest, these two thyristors 41 and 42 function, always according to the present invention, exactly in the same manner as thyristor 1 of FIG. 4 and as the two thyristors 21 and 22 of FIG. 5. To demonstrate this operational similitude the elements, according to the invention and totally identical to those of FIG. 4, have been designated in FIG. 6 by the same reference numerals, respectively preceded by a "3" for those associated with thyristor 41 and by a "4" for those associated with thyristor 42.

The diode half-bridge 37, 38 which is used for this assembly according to FIG. 6 makes it possible to minimize the drop in voltage at the terminals of the controllable switch and therefore its dissipated power, which is then of the order of 250 watts for 100 effective amperes passing through this controllable switch.

It goes without saying that the "principal" controllable switch or switches may be formed by components other than GTO thyristors, such as: IGBT transistors, bipolar transistors, field-effect transistors, an the like. In same way, the "auxiliary" switch or switches may be other than ordinary thyristors: GTO thyristors, IGBT transistors, or bipolar transistors, field-effect transistors. Similarly, the overvoltage arrester or arresters may be constituted by limiter elements other than varistors: Zener diodes, associations of varistor-discharger components, an the like.

We claim:

1. A device for protecting against operational overloads at the opening of static relays having semi-conductors in which each static relay includes at least one controllable switch and a protection circuit including at lest one overvoltage arrester adapted to protect the static relay against overvoltages at opening and at least one capacitor adapted to protect the static relay against voltage variations at the opening, the device comprising, the capacitor and the overvoltage arrester forming at least a part of a parallel circuit having a first terminal connected to one of two power terminals of the controllable switch and a second terminal connected to the other of the two power terminals through an auxiliary static relay, said auxiliary static relay being conducting at least from the beginning and at lest during the major portion of the duration of a phase opening of the controllable switch.

2. The device according to claim 1 in which said auxiliary static relay is constituted by at least one thyristor, said thyristor being extinguished by itself, after initiation of conduction, by the natural cancellation of current which transverses it, at the end of the phase opening of the controllable switch.

3. A device according to either one of claims 1 and 2, in which the static relay is supplied with A.C. voltage, the static relay including at least two controllable asymmetrical switches mounted in series and in opposite directions, each of said controllable switches being in series assembly with a parallel protection circuit and an auxiliary static relay, said controllable switches being placed in a half-bridge of rectifier diodes adapted to short-circuit, at each alternation of the supplied A.C. voltage, one of said asymmetrical controllable switches which would otherwise be subjected to a reverse voltage during such alternation.

4. A device according to either one of claims 1 and 2, in which the static relay is supplied with A.C. voltage, the static relay including at least two controllable symmetrical switches mounted in parallel and head-to-tail with respect to one another, each of said controllable switches being in series assembly with a parallel protection circuit and an auxiliary static relay.

* * * * *